(12) United States Patent
Eland

(10) Patent No.: US 6,525,933 B2
(45) Date of Patent: Feb. 25, 2003

(54) COMPUTER PERIPHERAL MOUNTING BRACKET

(75) Inventor: Michael P Eland, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/774,740

(22) Filed: Jan. 31, 2001

(65) Prior Publication Data

US 2002/0101713 A1 Aug. 1, 2002

(51) Int. Cl.[7] .................................................. G06F 1/16
(52) U.S. Cl. ....................................... 361/686; 361/683
(58) Field of Search ............................ 361/679, 683–686

(56) References Cited

U.S. PATENT DOCUMENTS

| | | | | |
|---|---|---|---|---|
| 4,964,017 A | * | 10/1990 | Jindrick et al. | 361/390 |
| 5,557,499 A | | 9/1996 | Reiter et al. | 361/685 |
| 5,588,728 A | | 12/1996 | Eldridge et al. | 312/332.1 |
| 5,761,033 A | * | 6/1998 | Wilhelm | 361/686 |
| RE35,915 E | | 10/1998 | Hastings et al. | 439/377 |
| 5,956,227 A | * | 9/1999 | Kitaoka | 361/695 |
| 6,052,278 A | | 4/2000 | Tanzer et al. | 361/685 |
| 6,084,768 A | | 4/2000 | Bolognia | 361/685 |
| 6,088,221 A | | 4/2000 | Bolognia | 361/685 |
| 6,061,244 A | * | 5/2000 | O'Sullivan et al. | 361/727 |
| 6,166,901 A | | 12/2000 | Gamble et al. | 361/685 |

* cited by examiner

Primary Examiner—Darren Schuberg
Assistant Examiner—Yean-Hsi Chang
(74) Attorney, Agent, or Firm—Kevin M. Hart

(57) ABSTRACT

A three-sided computer peripheral mounting bracket has two opposing guide rail sides and a front side but has no back side. The two opposing guide rail sides are operable to engage a computer chassis to guide the bracket during insertion and removal therefrom and to support the bracket after insertion therein. Each of the two opposing guide rail sides includes indented surfaces that are indented inward relative to outside surfaces of the guide rail sides. Each of the indented surfaces defines a recess for receiving an isolation grommet through which a computer peripheral device may be coupled to the bracket. Due to its shape, the bracket may be formed from a single piece of sheet metal. A spacer rod may be engaged between the isolation grommets to help keep the bracket square when it is not populated with the computer peripheral device. The front side of the bracket may include place holders for storing mounting screws and may include a curved handle.

28 Claims, 6 Drawing Sheets

COMPUTER PERIPHERAL MOUNTING BRACKET

FIELD OF THE INVENTION

This invention relates generally to techniques for mounting a peripheral device into a computer chassis.

BACKGROUND

Computer peripherals, including media drives such as hard disk drives, optical disk drives, tape drives, floppy disk drives and the like, are commonly mounted into the chassis of a computer. Various approaches have been employed for accomplishing this.

One approach has been to use a tray. In a tray-style mounting arrangement, the peripheral device is mounted to a receptacle or frame usually having a flat bottom of some kind. The receptacle or frame is then slid into and out of the computer chassis like a tray. Examples of the tray approach appear in the following U.S. Pat. Nos.: 5,588,728; 5,557,499; 6,084,768 and 6,088,221; 6,166,901; RE35,915; and 6,061,244.

Another approach for mounting computer peripherals has been to use a bracket. In a bracket-style mounting arrangement, the peripheral device is mounted to a bracket having no bottom. The bracket may then be slid into and out of the computer chassis. Examples of the bracket approach appear in U.S. Pat. No. 6,052,278; the "Octane" computer system manufactured by Silicon Graphics Inc.; and the "Ultra 60" computer system manufactured by Sun Computer Corp.

Yet another approach for mounting computer peripherals has been to use rails only. In a rails-only mounting arrangement, two separate guide rails are mounted directly to the peripheral device. The peripheral device itself is then slide into and out of the computer chassis using only the guide rails for support. Examples of this approach appear in the "Z-Pro" workstation computer manufactured by International Business Machines, Inc.; and the "Professional Workstation 6000" computer manufactured by Compaq Computer Corp.

One factor that has made peripheral mounting more difficult in recent years has been an ever-increasing demand for compactness in computer enclosures. For example, the current market for rack-mounted computers requires enclosure heights in multiples of 1.75 inches. By way of further background, 1.75 inches is a unit of height referred to in the industry as "1U." In order to compete effectively, manufacturers are now struggling with the challenge of mounting two or more media drives in a vertically stacked arrangement within the confines of a 2U, or 3.5 inches high, rack-mountable enclosure. While each of the above-mentioned products has proved useful in one context or another, most of them cannot be used in low-profile environments where two or more peripheral devices must be stacked inside the confines of a 2U enclosure. And, of the mentioned products that could be used in such a low-profile environment, each seems to lack one or more important features such as cost effectiveness, ease of use, and the ability to isolate the peripheral device from mechanical shocks.

SUMMARY OF THE INVENTION

In one aspect, a computer peripheral mounting bracket according to the invention has a low profile yet still provides important features such as cost effectiveness, ease of use, and the ability to isolate a peripheral device from mechanical shocks. The bracket includes two opposing guide rail sides and a front side but has no back side. The two opposing guide rail sides are operable to engage a computer chassis to guide the bracket during insertion and removal therefrom and to support the bracket after insertion therein. Each of the two opposing guide rail sides includes an indented surface that is indented inward relative to an outside surface of the guide rail side. Each of the indented surfaces defines a recess for receiving an isolation grommet through which a computer peripheral device may be coupled to the bracket.

In further aspects: Due to its shape, the bracket may be formed from a single piece of sheet metal. A spacer rod may be engaged between the isolation grommets to help keep the bracket square when it is not populated with the computer peripheral device. The front side of the bracket may include place holders for storing mounting screws, and may also include a handle.

DETAILED DESCRIPTION OF THE PREFERRED EMBODIMENTS

Figure 1:
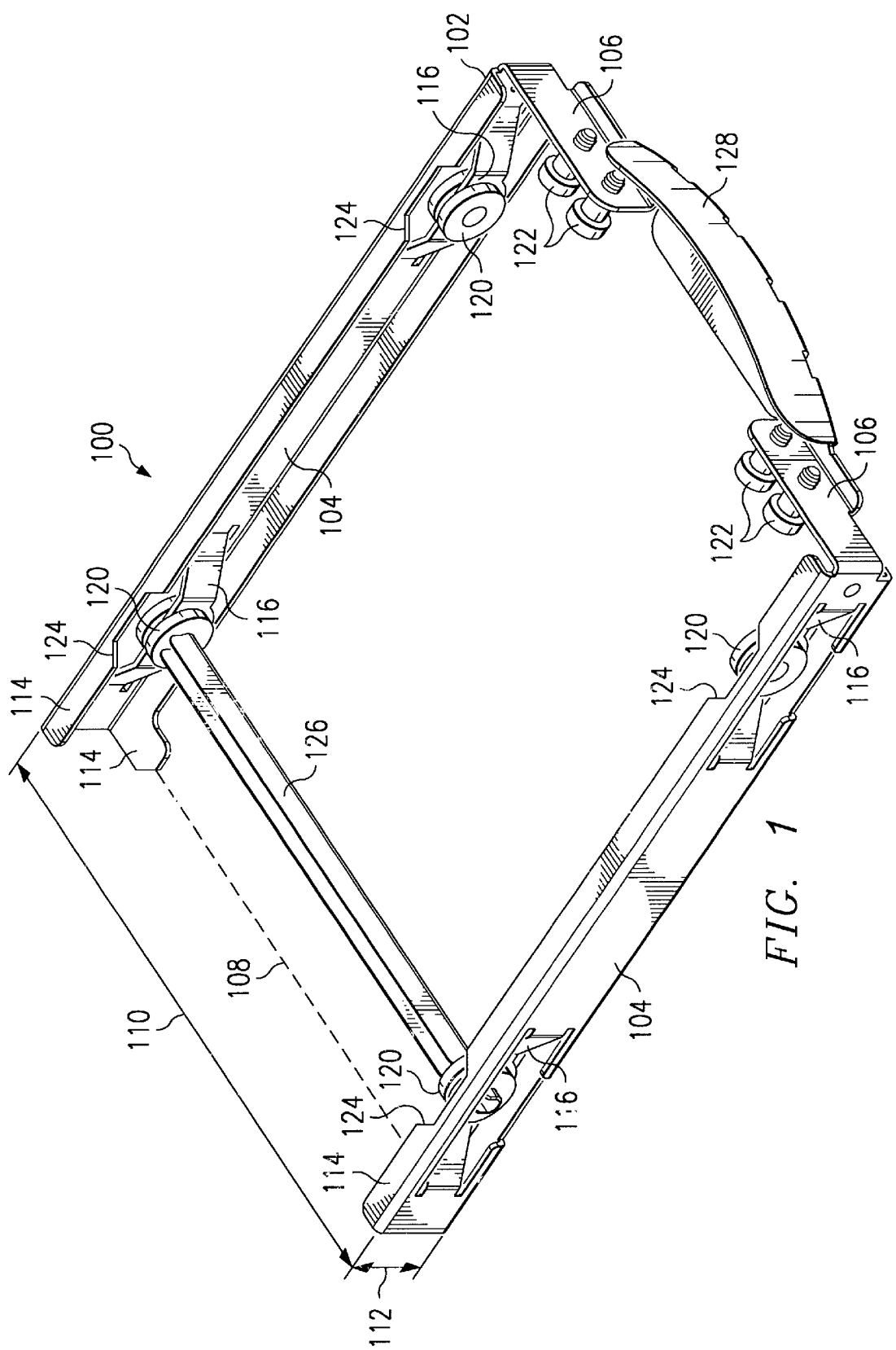
FIG. 1 is a top-front oblique view of a computer peripheral mounting bracket according to a preferred embodiment of the invention.
Figure 2:
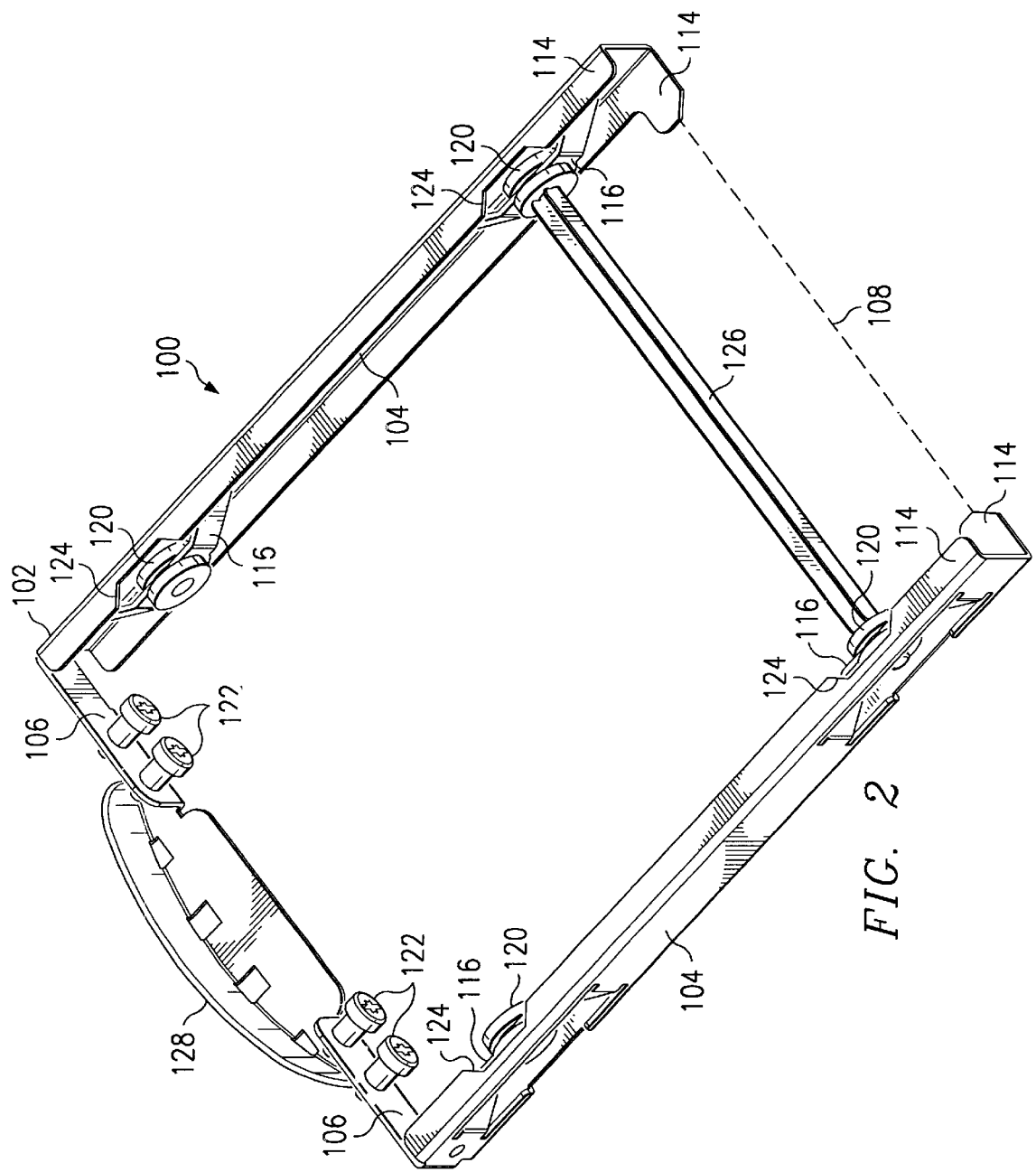
FIG. 2 is a top-rear oblique view of the computer peripheral mounting bracket of FIG. 1.
Figure 3:
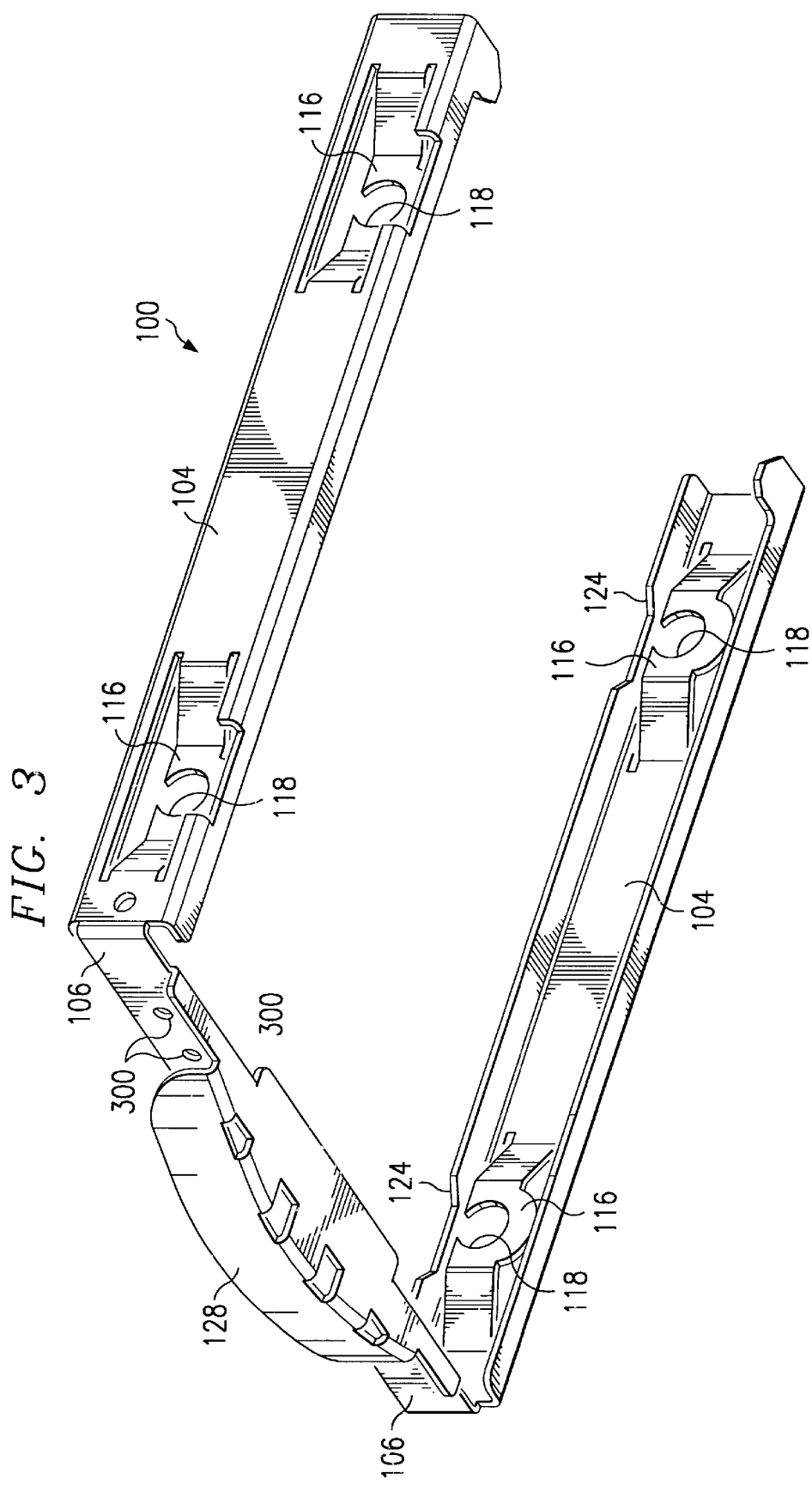
FIG. 3 is a bottom-front oblique view of the computer peripheral mounting bracket of FIG. 1 shown with isolation grommets and spacer rod removed.

FIGS. 1 and 2 illustrate a computer peripheral mounting bracket 100 according to one preferred embodiment of the invention. A three-sided bracket 102 includes two opposing guide rail sides 104 and a front side 106 but no back side 108. The width 110 of bracket 102 and the height 112 of guide rail sides 104 may be chosen so that guide rails 104 engage left, right, top and bottom guides of a receptacle formed in the chassis of a host computer enclosure (not shown). In this manner, the guide rail sides themselves may serve to guide bracket 102 during insertion into and removal from the computer chassis, and to support bracket 102 after insertion into the computer chassis. Thus, additional guide rail assemblies need not be fastened to bracket 102 to serve these purposes. In the embodiment shown, guide rail sides 104 have a generally unshaped cross section including a vertical side and two horizontal sections 114 on either end of the vertical side. Due to its inventive shape, bracket 102 may be constructed from a single piece of sheet metal using conventional techniques.

Figure 5:
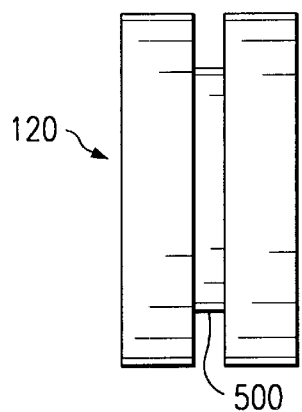
FIGS. 5 and 6 are side and oblique views, respectively, of one of the isolation grommets of FIG. 1.
Figure 6:
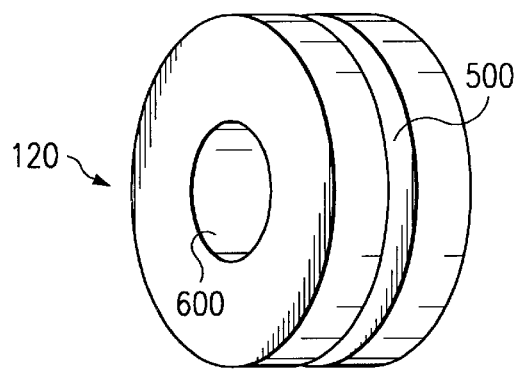
Figure 8:
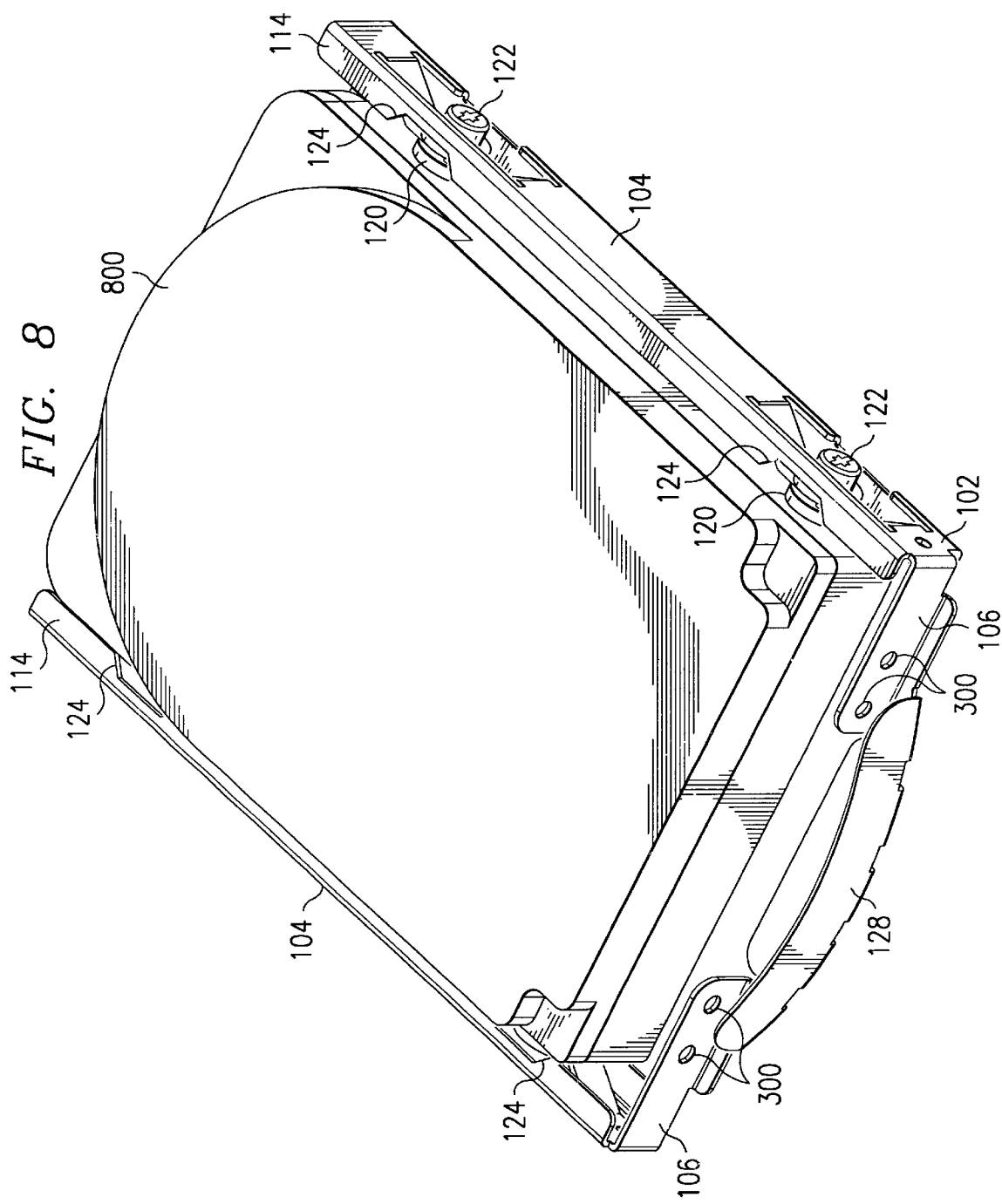
FIG. 8 is a top-front oblique view of the computer peripheral mounting bracket of FIG. 1 shown with a media drive unit mounted therein.

Each guide rail side 104 includes two indented surfaces 116. The indented surfaces 116 are indented toward the inside of bracket 102 relative to the outer surfaces of guide rail sides 104. Each indented surface 116 includes a recess 118 for receiving an isolation grommet 120. Isolation grommets 120 are shown in more detail in FIGS. 5 and 6. One mounting screw 122 is passed through each isolation grommet 120 in order to secure a computer peripheral device 800 to bracket 102, as shown in FIG. 8. Isolation grommets 120 provide a degree of isolation and energy dissipation between bracket 102 and peripheral device 800 in order to protect peripheral device 800 from mechanical shocks and vibration. Isolation grommets 120 may include a circular channel 500 for receiving indented surfaces 116, and a through hole 600 through which a mounting screw 122 may pass. Isolation grommets 120 may be made of an elastomeric material such as rubber for enhanced shock dampening functionality. In an embodiment, cut-out sections 124 were provided in guide rail sides 104 above indented surfaces 116 in order to facilitate installation of grommets 120 into recesses 118. Indented surfaces 116 were indented sufficiently from the outer side of guide rails 104 so that the heads of screws 122 would not protrude outside width 110 of bracket 102. (See FIG. 8.) In this manner, the heads of screws 122 will not interfere with the insertion of bracket 102 into the computer chassis and with its removal therefrom.

Figure 4:
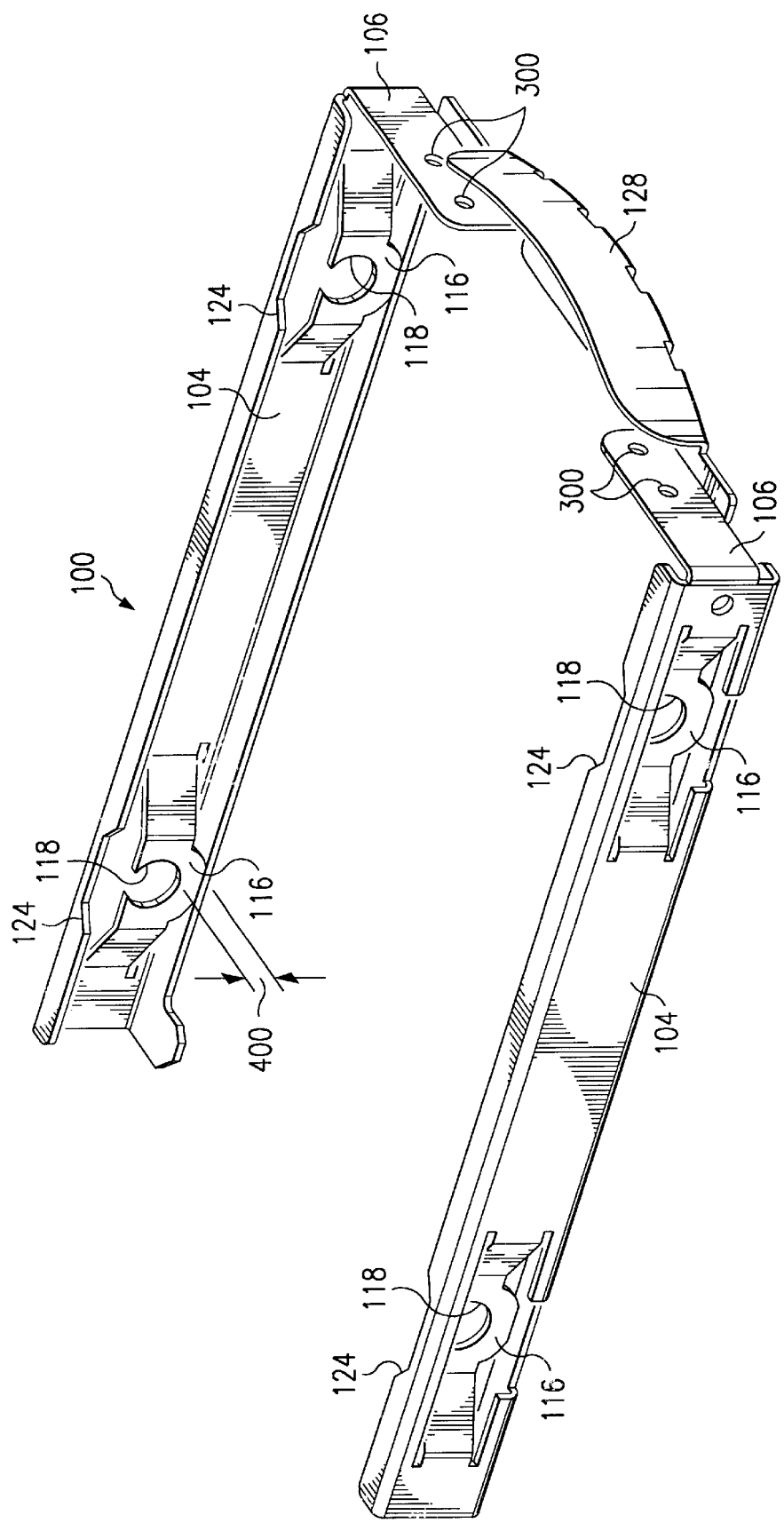
FIG. 4 is a top-front oblique view of the computer peripheral mounting bracket of FIG. 3.

In an embodiment, recesses 118 may be elevated by a distance 400 (see FIG. 4) relative to a bottom surface of guide rail sides 104. Distance 400 may be chosen so that the peripheral device 800 will not touch a horizontal work surface on which bracket 102 rests when bracket 102 is not installed in a host computer chassis. This elevation provides yet another degree of protection to peripheral device 800 after it has been fastened to bracket 102.

It will be useful, on occasion, to install bracket 102 into the host computer chassis even when no peripheral device 800 is mounted inside bracket 102. For example, such an empty installation may help to reduce electromagnetic emissions escaping from the chassis, and also enables bracket 102 to be conveniently stored for later use. In order to help ensure the squareness of bracket 102 during empty installations of this kind, a spacer rod 126 may be included with bracket 102. The length of spacer rod 126 is such that its ends may be inserted into through holes 600 of the two isolation grommets 120 nearest the back side 108 of bracket 102. Spacer rod 126 extends between the grommets as shown in FIGS. 1 and 2, thus helping to retain the bracket's shape and squareness.

Figure 7:
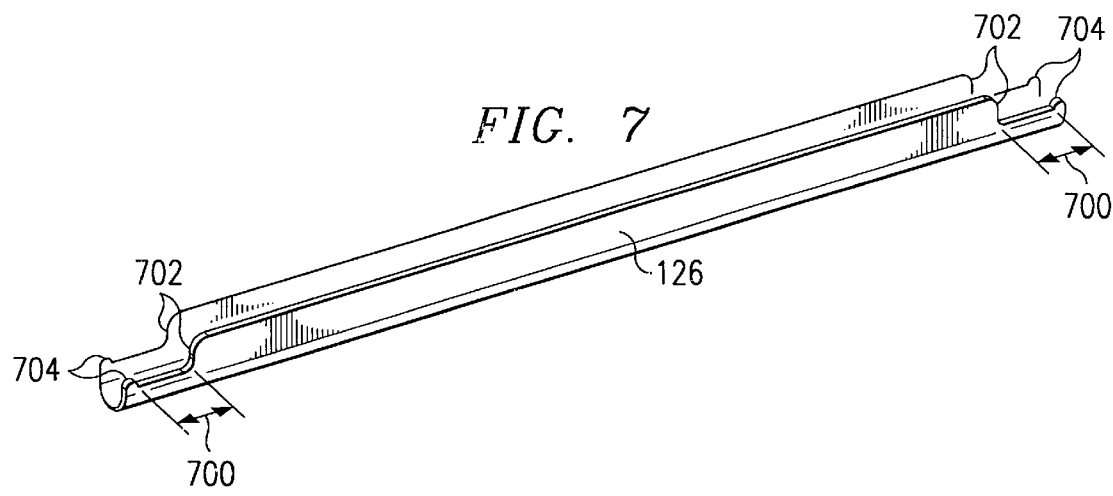
FIG. 7 is an oblique view of the spacer rod of FIG. 1.

In an embodiment, spacer rod 126 may be conveniently made from sheet metal and given a generally unshaped cross section for rigidity as shown in FIG. 7. End sections 700 are for insertion into through holes 600 of the isolation grommets 120. Protrusions 702 engage side surfaces of the isolation grommets 120 so as to limit insertion of end sections 700 therein. Protrusions 704 are capable of passing through the through holes 600 of an elastomeric grommet 120 and to engage the side of grommet 120 opposite that engaged by protrusions 702. Thus, protrusions 704 help to retain spacer rod 126 in position once it has been inserted into the grommets 120.

Place holders 300 may be provided on front side 106 of bracket 102. Place holders 300 serve the purpose of retaining screws 122 while they are not in use securing a peripheral device to the bracket 102. In a low-profile bracket 102, it is helpful to orient place holders 300 so that the axes of screws 122 retained therein will be parallel to the longitudinal axes of guide rail sides 104, as shown in FIGS. 1 and 2. In this manner, the screws 122 are prevented from interfering as the bracket 102 is slid into and out of the host computer chassis. In the embodiment shown, place holders 300 are made simply with a threaded hole.

A handle 128 may be disposed on front side 106 of bracket 102. In an embodiment, handle 128 was integrally formed with bracket 102 and was given a curved shape that was concave toward the back 108 of bracket 102. The curved shape served to enhance the rigidity of handle 128 and made it easy to grasp.

What is claimed is:

1. A computer peripheral mounting bracket, comprising:

a three-sided bracket having two opposing guide rail sides and a front side but having no back side;

wherein the two opposing guide rail sides are operable to engage a computer chassis to guide the bracket during insertion and removal therefrom and to support the bracket after insertion therein;

wherein each of the two opposing guide rail sides comprises at least one indented surface that is indented inward relative to an outside surface of the guide rail side; and wherein each of the indented surfaces defines a recess for receiving an isolation grommet through which a computer peripheral device may be coupled to the bracket.

2. The computer peripheral mounting bracket of claim 1, wherein:

each of the recesses is elevated relative to a bottom surface of the guide rail sides such that the computer peripheral device, after having been coupled to the bracket through the isolation grommets, is also elevated relative to the bottom surface of the guide rail sides.

3. The computer peripheral mounting bracket of claim 1, wherein:

each of the guide rail sides comprises a generally unshaped cross section.

4. The computer peripheral mounting bracket of claim 1, wherein:

each of the guide rail sides comprises a cut-out above the indented surface to facilitate insertion of the isolation grommet into the recess.

5. A computer peripheral mounting bracket, comprising:

a three-sided bracket having two opposing guide rail sides and a front side but having no back side;

wherein the two opposing guide rail sides are operable to engage a computer chassis to guide the bracket during insertion and removal therefrom and to support the bracket after insertion therein;

wherein each of the two opposing guide rail sides comprises at least one indented surface that is indented inward relative to an outside surface of the guide rail side;

wherein each of the indented surfaces defines a recess for receiving an isolation grommet through which a computer peripheral device may be coupled to the bracket; and further comprising a spacer rod operable to be engaged between the isolation grommets to help keep the bracket square when it is not populated with the computer peripheral device.

6. The computer peripheral mounting bracket of claim 5, wherein the spacer rod comprises:

end sections for insertion into the isolation grommets; and first protrusions for limiting insertion of the end sections into the isolation grommets by engaging first side surfaces of the isolation grommets.

7. The computer peripheral mounting bracket of claim 6, wherein the spacer rod comprises:

second protrusions capable of passing through a through hole in the isolation grommets but engaging a second side surface of the isolation grommets after having passed through, the second protrusions operable to help retain the spacer bar in the isolation grommets.

8. The computer peripheral mounting bracket of claim 5, wherein the spacer rod comprises:
a generally unshaped cross section.

9. The computer peripheral mounting bracket of claim 5, wherein:
each of the recesses is elevated relative to a bottom surface of the guide rail sides such that the computer peripheral device, after having been coupled to the bracket through the isolation grommets, is also elevated relative to-the bottom surface of the guide rail sides.

10. The computer peripheral mounting bracket of claim 5, wherein:
each of the guide rail sides comprises a generally unshaped cross section.

11. The computer peripheral mounting bracket of claim 5, wherein:
each of the guide rail sides comprises a cut-out above the indented surface to facilitate insertion of the isolation grommet into the recess.

12. A computer peripheral mounting bracket, comprising:
a three-sided bracket having two opposing guide rail sides and a front side but having no back side;
wherein the two opposing guide rail sides are operable to engage a computer chassis to guide the bracket during insertion and removal therefrom and to support the bracket after insertion therein;
wherein each of the two opposing guide rail sides comprises at least one indented surface that is indented inward relative to an outside surface of the guide rail side;
wherein each of the indented surfaces defines a recess for receiving an isolation grommet through which a computer peripheral device may be coupled to the bracket; and
wherein the three-sided bracket is formed from a single piece of sheet metal.

13. The computer peripheral mounting bracket of claim 12, wherein:
each of the recesses is elevated relative to a bottom surface of the guide rail sides such that the computer peripheral device, after having been coupled to the bracket through the isolation grommets, is also elevated relative to the bottom surface of the guide rail sides.

14. The computer peripheral mounting bracket of claim 12, wherein:
each of the guide rail sides comprises a generally unshaped cross section.

15. The computer peripheral mounting bracket of claim 12, wherein:
each of the guide rail sides comprises a cut-out above the indented surface to facilitate insertion of the isolation grommet into the recess.

16. A computer peripheral mounting bracket, comprising:
a three-sided bracket having two opposing guide rail sides and a front side but having no back side;
wherein the two opposing guide rail sides are operable to engage a computer chassis to guide the bracket during insertion and removal therefrom and to support the bracket after insertion therein;
wherein each of the two opposing guide rail sides comprises at least one indented surface that is indented inward relative to an outside surface of the guide rail side;
wherein each of the indented surfaces defines a recess for receiving an isolation grommet through which a computer peripheral device may be coupled to the bracket; and
wherein the front side comprises at least one place holder for a mounting screw.

17. The computer peripheral mounting bracket of claim 16, wherein:
the place holder is operable to retain the mounting screw so that the axis of the mounting screw is parallel with axes of the guide rail sides.

18. The computer peripheral mounting bracket of claim 16, wherein:
the place holder comprises a threaded hole.

19. The computer peripheral mounting bracket of claim 16 wherein:
each of the recesses is elevated relative to a bottom surface of the guide rail sides such that the computer peripheral device, after having been coupled to the bracket through the isolation grommets, is also elevated relative to the bottom surface of the guide rail sides.

20. The computer peripheral mounting bracket of claim 16, wherein:
each of the guide rail sides comprises a generally unshaped cross section.

21. The computer peripheral mounting bracket of claim 16, wherein:
each of the guide rail sides comprises a cut-out above the indented surface to facilitate insertion of the isolation grommet into the recess.

22. A computer peripheral mounting bracket, comprising:
a three-sided bracket having two opposing guide rail sides and a front side but having no back side;
wherein the two opposing guide rail sides are operable to engage a computer chassis to guide the bracket during insertion and removal therefrom and to support the bracket after insertion therein;
wherein each of the two opposing guide rail sides comprises at least one indented surface that is indented inward relative to an outside surface of the guide rail side;
wherein each of the indented surfaces defines a recess for receiving an isolation grommet through which a computer peripheral device may be coupled to the bracket; and
further comprising a handle disposed on the front side.

23. The computer peripheral mounting bracket of claim 22, wherein:
the handle is integrally formed With the bracket.

24. The computer peripheral mounting bracket of claim 22, wherein:
the handle defines a curve that is concave toward the back of the bracket.

25. The computer peripheral mounting bracket of claim 22, wherein:
each of the recesses is elevated relative to a bottom surface of the guide rail sides such that the computer peripheral device, after having been coupled to the bracket through the isolation grommets, is also elevated relative to the bottom surface of the guide rail sides.

26. The computer peripheral mounting bracket of claim 22, wherein:
each of the guide rail sides comprises a generally unshaped cross section.

27. The computer peripheral mounting bracket of claim 22, wherein:

each of the guide rail sides comprises a cut-out above the indented surface to facilitate insertion of the isolation grommet into the recess.

28. A computer peripheral mounting bracket, comprising:

a three-sided bracket having two opposing guide rail sides and a front side but having no back side;

wherein the two opposing guide rail sides are operable to engage a computer chassis to guide the bracket during insertion and removal therefrom and to support the bracket after insertion therein;

wherein each of the two opposing guide rail sides comprises at least one indented surface that is indented inward relative to an outside surface of the guide rail side;

wherein each of the indented surfaces defines a recess for receiving an isolation grommet through which a computer peripheral device may be coupled to the bracket;

further comprising a spacer rod operable to be engaged between the isolation grommets to help keep the bracket square when it is not populated with the computer peripheral device;

wherein the three-sided bracket is formed from a single piece of sheet metal;

wherein the front side comprises at least one place holder for a mounting screw; and further comprising a handle disposed on the front side.

* * * * *

UNITED STATES PATENT AND TRADEMARK OFFICE
CERTIFICATE OF CORRECTION

PATENT NO.   : 6,525,933 B2
DATED        : February 25, 2003
INVENTOR(S)  : Michael P. Eland It is certified that error appears in the above-identified patent and that said Letters Patent is hereby corrected as shown below:

<u>Column 4,</u>
Line 31, delete "unshaped" and insert therefor -- u-shaped --

<u>Column 5,</u>
Lines 6, 17 and 51, delete "unshaped" and insert therefor -- u-shaped --

<u>Column 6,</u>
Line 26, delete "unshaped" and insert therefor -- u-shaped --
Line 51, delete "With" and insert therefor -- with --

Signed and Sealed this

Sixth Day of July, 2004

JON W. DUDAS
*Acting Director of the United States Patent and Trademark Office*